US005558723A

United States Patent [19]
Ufert

[11] Patent Number: 5,558,723
[45] Date of Patent: Sep. 24, 1996

[54] THIN-FILM SOLAR MODULE WITH ELECTRICALLY CONDUCTIVE SUBSTRATE AND METHOD FOR THE MANUFACTURE THEREOF

[75] Inventor: Klaus-Dieter Ufert, Unterschleissheim, Germany

[73] Assignee: Siemens Solar GmbH, Munich, Germany

[21] Appl. No.: 419,547

[22] Filed: Apr. 10, 1995

[30] Foreign Application Priority Data

Apr. 15, 1994 [DE] Germany .......................... 44 13 215.8

[51] Int. Cl.[6] .......................... H01L 31/042; H01L 31/18
[52] U.S. Cl. .......................... 136/244; 136/256; 136/258; 136/265; 437/2; 437/51; 437/64; 437/205; 437/228; 427/126.3; 427/333; 427/419.3
[58] Field of Search .......................... 136/244, 256, 136/258 AM, 265; 437/2–5, 51, 61, 63–64, 205, 228; 427/126.3, 271, 333, 419.2, 419.3

[56] References Cited

U.S. PATENT DOCUMENTS

| | | | |
|---|---|---|---|
| 4,806,436 | 2/1989 | Tada et al. | 428/34 |
| 5,128,181 | 7/1992 | Kunert | 428/629 |

FOREIGN PATENT DOCUMENTS

| | | | |
|---|---|---|---|
| 60-260165 | 12/1985 | Japan | 136/256 |
| 61-284971 | 12/1986 | Japan | 136/256 |
| 62-142366 | 6/1987 | Japan | 136/256 |

*Primary Examiner*—Aaron Weisstuch
*Attorney, Agent, or Firm*—Hill, Steadman & Simpson

[57] ABSTRACT

A solar module has a thin-film structure applied on an aluminum substrate, with the back electrode insulated from the electrically conductive aluminum substrate by an electrically insulating oxide layer. The aluminum substrate can be an aluminum facade element or can be joined to an aluminum facade element. For producing the insulating oxide layer, a known method for the manufacture of electrically conductive oxide electrodes composed of zinc oxide is utilized in a form modified to produce the solar module.

7 Claims, 1 Drawing Sheet

THIN-FILM SOLAR MODULE WITH ELECTRICALLY CONDUCTIVE SUBSTRATE AND METHOD FOR THE MANUFACTURE THEREOF

BACKGROUND OF THE INVENTION

1. Field of the Invention

The present invention is directed to a thin-film solar module of the type having an electrically conductive substrate, as well as to a method for manufacturing such a module.

2. Description of the Prior Art

Thin-film solar cells can be produced directly on large-area substrates. The use of economically priced substrates such as, for example, window glass, production in plasma deposition systems having high area throughput, wirings integrated into the manufacturing process, and the relatively low costs of materials of the thin semiconductor layer are important advantages of thin-film solar modules compared to solar modules with crystalline solar cells.

The most significant disadvantage of thin-film solar modules and, in particular, those composed of amorphous silicon, is in the relatively low efficiency. For offering the same electrical power, this requires a larger module area compared to crystalline solar cells and requires a correspondingly larger base area for supporting the modules.

It has therefore already been proposed that facade elements composed of glass be coated, in particular, with thin-film solar cells, or that solar modules on glass substrates be employed as facade elements. In addition to the photovoltaically generated current, the solar modules can serve both for decoratively fashioning the facade and to provide a separate technical function. For example, semi-transparent solar modules can serve as windows, whereas solar modules equipped with appropriate insulating glass can serve the purpose of thermal insulation of buildings. Embodiments of solar modules utilized in this way are disclosed, for example, in U.S. Pat. No. 5,128,181.

In this context, it is a disadvantage that, using thin-film solar modules, one is largely bound to the employment of flat glass panes as the substrate material. This highly restricts the possibility of functional use thereof as a facade element.

SUMMARY OF THE INVENTION

It is an object of the present invention to provide a thin-film solar module that is simple and economical in terms of manufacture and that is especially suitable for employment as a facade element.

The above object is achieved in accordance with the principles of the present invention in a solar module having a thin-film structure, including an aluminum substrate, an electrically insulating oxide layer adjacent the aluminum substrate, a back electrode layer adjacent the insulating layer, and a front electrode composed of a transparent, conductive oxide, the solar module being structured to form a plurality of integrated, series-interconnected individual solar cells and forming a facade element.

The basic idea of the invention is to use a substrate composed of aluminum for a thin-film solar cell. Since this, however, is electrically conductive, the back electrode layer structured into individual electrodes must be insulated from the electrically conductive substrate by an electrically insulating oxide layer. Only in this way is an integrated series connection of the individual solar cells of the solar module that belong to the individual electrodes possible.

The aluminum substrate can be a conventional aluminum facade element. This provides the advantage that the known aluminum facade element—with its relatively low weight, its good workability and high mechanical strength—also has a versatile and nearly unlimited shapeability that is not the case for thin-film solar modules having a glass substrate. The use possibilities of the thin-film solar module with an aluminum substrate as a facade element are therefore more varied than for corresponding glass modules. The shapeability thereby relates to the surface of the solar module or of the facade element formed thereby, as well as to the arbitrarily shaped edge region. This is particularly significant for the fastening of the solar module or of the facade element. It can be fashioned flat or can also have a non-linear structure.

The solar module can be directly produced or deposited on a known facade element. It is also possible, however, to produce the solar module on an aluminum substrate that is relatively thin compared to the facade element, particularly on an aluminum foil, and only subsequently to join this to the facade element. This can facilitate the production of the solar module independently of the shape of the facade element. Moreover, good methods are known for reliably joining the aluminum substrate to the aluminum facade element.

Apart from the new substrate and the electrically insulating layer, the remainder of the structure of the inventive solar module is conventional. Accordingly, methods that are well-known can also be employed for manufacturing the thin-film structure of the solar module. In the simplest and also most advantageous embodiment of the invention, the back electrode applied on the substrate as well as the front electrode are composed of a thin, conductive oxide. An arbitrary thin-film semiconductor material that can be combined with the conductive oxide can be employed for the active semiconductor layer. Amorphous silicon a-Si:H and its alloys as well as suitable compound semiconductors having an adequate band gap are thereby especially suitable. Chalcopyrite of the compound type $I-III-VI_2$, whose best known representative is copper indium selenide (CIS), is well-suited.

Metallic back electrodes, however, are suitable in addition to the back electrode of electrically conductive oxide. In particular, these can be of advantage when the electrically insulating oxide layer is especially thick. In this case, a metallic back electrode exhibits better adhesion. Extremely good adhesion of the thin-film structure on the aluminum substrate or, respectively, on the electrically insulating oxide layer thereof, is also achieved with TCO (electrically conductive oxide) back electrodes given a thin, electrically insulating oxide layer. It is also possible to first apply an adhesion-promoting metal layer over the electrically insulating oxide layer and to apply a back electrode of TCO thereover.

Aluminum oxide is suitable as the electrically insulating oxide layer. This can be a natural aluminum oxide layer grown by exposure to air. A minimum thickness and an adequate density of the oxide, however, must thereby be assured. An adequate oxide thickness begins at approximately 10–20 micrometers. Since natural aluminum oxide, however, grows in a structure that is unfavorable for electrical insulation purposes and various atmospheric influences also lead to uncontrollable and, therefore, unreproducible oxide layers, an oxide layer that is grown in controlled fashion, or that is artificially generated, is preferable. To that end, a pure aluminum surface can be coated with an oxide layer that, for example, is 20 micrometers thick by, for example, anodic oxidation. It is also possible, however, to apply an electrically insulating oxide on the aluminum surface with a thin-film deposition process.

In a preferred embodiment of the invention, the electrically insulating oxide is composed of the same oxide as the TCO back electrode, but modified so as to be electrically insulating. An electrically insulating oxide can thereby be deposited first by influencing process parameters during the application of the back electrode, for example by raising the substrate temperature and/or by omitting the dopant. Since these parameters can be set easily, the manufacture of the electrically insulating oxide layer can be easily integrated into the manufacturing process for the back electrode and can be implemented in the same reactor.

DESCRIPTION OF THE PREFERRED EMBODIMENTS

Figure 1:
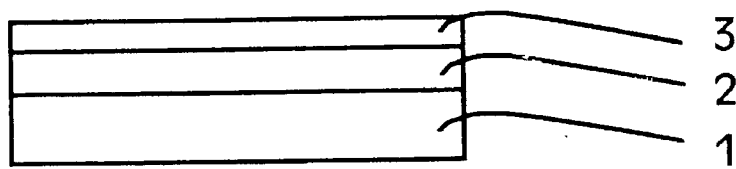
FIG. 1 is a schematic cross section of a first embodiment of a solar module constructed in accordance with the principles of the present invention.
Figure 2:
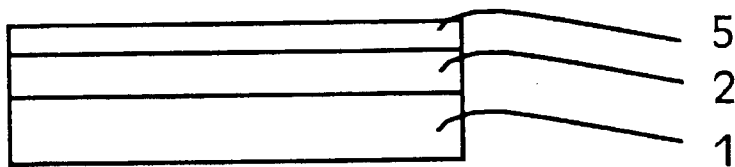
FIG. 2 is a schematic cross section of a second embodiment of a solar module constructed in accordance with the principles of the present invention.

1. Generating an electrically insulating oxide layer (FIGS. 1 and 2).

An aluminum foil, or an aluminum plate or panel or a facade element composed of aluminum can be employed as an aluminum substrate 1. Without subsequent mechanical reinforcement, an aluminum layer thickness of about 3 mm is suitable for assuring an adequate mechanical strength for the thin-film solar module, for the facade element. When the aluminum substrate 1 is to be joined to a facade element composed of aluminum only in a later step, a significantly thinner aluminum substrate 1 can be employed, for example a foil that is 100 micrometers thick.

Immediately after being manufactured, the aluminum substrate 1 is coated with an oxide layer 2 by anodic oxidation. It is also possible to reinforce a natural aluminum oxide that arose by oxidation in air by anodic oxidation, or to etch away such a natural oxide before the anodic oxidation. In order to have an electrically insulating effect, a thickness of about 20 micrometers is adequate for the oxide layer 2.

2. Producing a TCO Back Electrode (FIG. 1 ).

A back electrode of electrically conductive oxide (TCO) can now be deposited directly over the aluminum substrate 1 provided with an electrically insulating oxide layer. For example, aluminum-doped, boron-doped, and/or hydrogen-doped zinc oxide, indium tin oxide, or fluorine-doped tin oxide are suitable TCO materials.

A CVD method wherein, for example, volatile metallo-organic compounds are decomposed on the hot substrate in an oxygen-containing atmosphere is suitable for applying the TCO layer. It is also possible to generate the TCO layer by sputtering from an appropriate metal oxide target in an oxygen-containing atmosphere or by sputtering from a metal oxide target in an inert atmosphere. Doped zinc oxide is preferred because of its good and easily set morphological properties. A layer thickness of, for example, 1.5 micrometers is adequate for the zinc oxide.

3. Generating a Back Electrode of Metal (FIG. 2)

A back electrode of metal 5 can also be applied over the aluminum substrate 1 provided with an anodically generated oxide layer 2. Alternatively, an adequately thick native aluminum oxide is suitable as the insulating oxide layer 2.

Various metals such as, for example, molybdenum, silver, aluminum, or combinations of the metals are suitable as back electrode material. The back electrode 5 can be applied by sputtering, vapor-deposition, or a CVD process. Dependent on the electrical conductivity of the metal selected for the back electrode 5, an adequately electrically conductive back electrode can be fashioned correspondingly thinner than a TCO back electrode and, for example, can be 500 nm thick.

Figure 3:
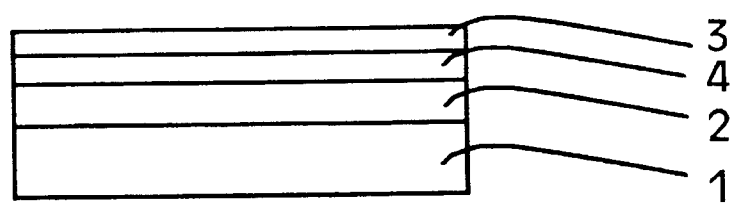
FIG. 3 is a schematic cross section of a third embodiment of a solar module constructed in accordance with the principles of the present invention.

4. Generating a Metallic Intermediate Layer (FIG. 3).

Given an aluminum substrate 1 that has an aluminum oxide layer 2 that is more than, for example, 10 micrometers thick, a metallic intermediate layer 4 under a back electrode 3 composed of TCO can contribute to an improved adhesion of the later solar module on the substrate. In particular, the metallic intermediate layer 4 should compensate differences in the thermal expansion behavior of back electrode 3, oxide layer 2 and aluminum substrate 1. Thin layers of appropriately soft metal such as, for example, silver are therefore suitable. The metal layer 4 can be applied in a way similar to the metallic back electrode 5 described in method step 3. Effective layer thicknesses are in the range from approximately 100 through 1000 nm.

5. Common Generation of Oxide Layer and Back Electrode (FIG. 1 ).

An electrically insulating oxide layer 2 can be produced in common with the back electrode 3 composed of TCO on the basis of an appropriate modification of the deposition conditions for the TCO material. A thin zinc oxide layer 2 is first deposited, in a non-conductive modification, directly over the aluminum substrate 1, which may possibly be provided with a thin, native aluminum oxide layer. A CVD process is preferably selected therefor wherein the high oxygen saturation of the zinc oxide required for the electrical insulation can be achieved in a simple way with a higher substrate temperature T1 during the CVD process in an oxygen-containing atmosphere. The higher substrate temperature itself can then be adequate for generating an insulating oxide layer 2 when the CVD atmosphere already contains the additives that usually produce a doping in the zinc oxide that increases the electrical conductivity. Preferably, however, this doping additive is only added to the CVD atmosphere after the electrically insulating zinc oxide layer 2 has been produced.

When the electrically insulating zinc oxide layer 2 has been formed with an adequate thickness of, for example, 500 nm, the substrate temperature is lowered to a value T2, and the other deposition conditions are also set to the standard, optimum values. When the substrate temperature is the sole parameter which is varied, then the deposition temperature T2 suitable for producing a back electrode 3 can lie, for example, 50 degrees Celsius below the substrate temperature T1 for the production of the electrically insulating zinc oxide layer 2. In general $T1=T2+\delta T$, with $15°<\delta T<60°$ (all values being degrees Celsius).

Figure 4:
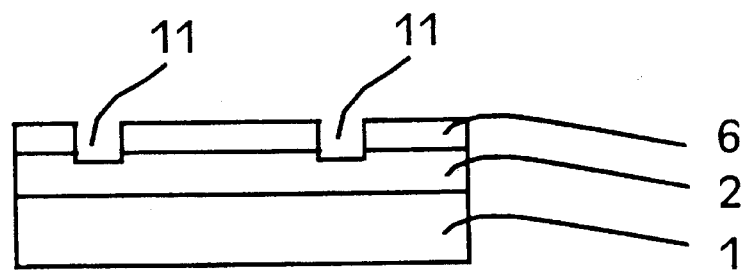
FIGS. 4 and 5 respectively show sequential steps, in schematic cross section, for producing individual solar cells from any one of the embodiments of the solar module shown in FIGS. 1, 2 and 3.

6. Structuring the Back Electrode (FIG. 4).

For achieving a higher module voltage, it is necessary to subdivide the thin-film solar cell to be produced on the large-area substrate into a series of individual or discrete solar cells and to directly connect these integrated in series during the manufacturing process. To that end, the back electrode 3 or 5 is divided in a first step into a number of identical electrode areas 6 that are electrically separated from one another. In the simplest embodiment, the large-area back electrode is divided by strip-shaped structuring into the corresponding electrode areas separated from one another. To that end, it is necessary to electrically separate regions of the back electrode that is composed of metal 5 or TCO 3, and possibly, of a metallic intermediate layer, from one another by producing trenches 11. To that end, the entire back electrode must be completely removed in the region of the trenches 11, whereby the trench 11 either exposes the surface of the oxide layer 2 or partially extends thereinto, as shown, for instance, in FIG. 4. In no case, however, can the trench 11 be so deep that the aluminum substrate 1 is exposed.

Producing the trenches 11 can be accomplished in a simple way on the basis of an erosion of material with a laser, whereby the desired depth of the trench to be generated can be set via the laser power. It is also possible to mechanically produce the trenches by milling, sawing, scoring or similar steps. The desired depth of the trenches 11 is produced by observing adequate mechanical precision.

Figure 5:
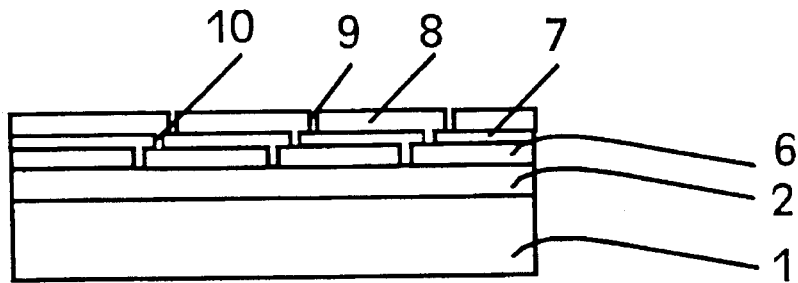

FIG. 5: For finishing the solar module of the invention, an active semiconductor layer with a diode structure is first produced over the back electrode which has been divided into individual electrode areas 6. Appropriate, known methods can be employed therefor. For example, an active semiconductor layer 7 of amorphous silicon a-Si:H is deposited with a plasma-enhanced CVD process (PECVD). This can ensue in what is referred to as a single-chamber reactor or in a continuous process through a number of chambers connected following one another, whereby a different diode layer is generated in each chamber. It is also possible to generate the diode structure by deposition in a number of processes separated from one another, what is referred to as an inline process.

As a consequence of the non-transparent aluminum substrate 1, a layer sequence of n-i-p is selected for the active semiconductor layer 7 composed of amorphous silicon. In order to avoid entrainment of the n-dopant gas phosphine in the single-chamber reactor, a ramp-like gas rinsing with hydrogen is implemented during a ramp-like reduction of the rf power. The goal is thereby to substantially completely deposit silane and phosphine to be decomposed, namely during the ramp without having the plasma burn out. When the reactor atmosphere has been largely depleted of gasses to be deposited, the rf power is raised back to the original value and pure silane is thereby simultaneously admitted into the reactor for producing the i-layer.

After the completion of the active semiconductor layer 7 in the n-i-p diode structure, the structuring of the active semiconductor layer 7, deposition of the front electrode 8 and structuring thereof follow as further, known method steps. The structuring steps can ensue like the structuring of the back electrode 6. The active semiconductor layer 7 is preferably structured with a laser, whereas the front electrode 8 composed of a TCO layer can be alternatively structured by a lift-off technique.

Alternatively, a structuring of the active semiconductor layer 7 can be foregone when the low-impedance regions 10 (see FIG. 5) required for interconnection are produced in some other way. This can ensue, for example, by phase conversion of the active semiconductor layer by coupling in energy via a laser.

A chalcopyrite layer can also be deposited over the back electrode 6 as the active semiconductor layer 7. To that end, metallic layers containing, for example, copper and indium are first deposited with a thin-film method and are subsequently converted into copper indium selenide in a reactive atmosphere that contains selenium. Such a method may be as disclosed, for example, in PCT Application WO 93/00814. The diode structure is completed by depositing a thin window layer of cadmium sulfide. The structuring of the active semiconductor layer 7 of chalcopyrite can ensue in the same way as in the case of a-Si:H. A TCO material is also selected again for the front electrode, particularly a doped zinc oxide.

If a facade element composed of aluminum or an adequate thick aluminum plate or panel is used as the aluminum substrate 1, a direct sealing (passivation) of the solar module from environmental influences can now ensue. This can ensue with a protective lacquer or by laminating a protective foil or film thereon.

If an adequately thin and flexible aluminum substrate 1 is used for the thin-film solar module, then this can be integrated with an aluminum facade element before the sealing. To that end, the coated aluminum substrate 1 is joined to a plastic material and a thin metal plate such that a photovoltaically active facade element is produced.

Although modifications and changes may be suggested by those skilled in the art, it is the intention of the inventor to embody within the patent warranted hereon all changes and modifications as reasonably and properly come within the scope of his contribution to the art.

I claim as my invention:

1. A thin-film solar module comprising, in sequence:

an aluminum substrate;

an electrically insulating oxide layer disposed on and adjacent said aluminum substrate;

an electrically conducting, back electrode layer comprising an electrically conductive oxide layer disposed on and adjacent said electrically insulating oxide layer, said back electrode layer having a plurality of trenches therein dividing said back electrode layer into a plurality of back electrode layer regions, said electrically insulating oxide layer comprising an oxide which is the same as said back electrode layer but rendered electrically insulating;

an active semiconductor layer disposed in registry with and adjacent each back electrode layer region;

a front electrode composed of a transparent, conductive oxide disposed on and adjacent said active semiconductor layer; and said back electrode layer regions, said active semiconductor layer and said front electrode, in combination, comprising a plurality of integrated, series-interconnected individual solar cells and forming a facade element.

2. A solar module as claimed in claim 1 wherein said back electrode layer comprises a layer of doped zinc oxide.

3. A solar module as claimed in claim 1 wherein said active semiconductor layer comprises amorphous silicon and has an n-i-p diode structure.

4. A solar module as claimed in claim 1 wherein said active semiconductor layer comprises a compound semiconductor material of the type I–III–VI$_2$.

5. A method for producing a plurality of electrode areas electrically separated from each other on an electrically conductive substrate, comprising the steps of:

depositing a first, electrically insulating zinc oxide layer surface-wide directly on a substrate at a first deposition temperature T1;

depositing a second, electrically conductively doped zinc oxide layer surface-wide over said first, electrically insulating zinc oxide layer, at a second substrate temperature T2, with $T1=T2+\delta T$ and $15°<\delta T<60°$; and structuring said second, electrically conductively doped zinc oxide layer into a plurality of regions electrically separated from each other by generating a plurality of separating trenches in said second, electrically conductively doped zinc oxide layer which extend at least to said first, electrically insulating zinc oxide layer.

6. A method as claimed in claim 5 wherein the steps of depositing said first and second zinc oxide layers are further defined by depositing each of said first and second zinc oxide layers with a CVD process, and comprising the additional step of doping said second, electrically conductively doped zinc oxide layer with a dopant selected from the group consisting of aluminum and boron.

7. A method as claimed in claim 5 wherein the step of structuring said second, electrically conductively doped zinc oxide layer comprises producing said trenches in said second, electrically conductively doped zinc oxide layer with a laser.

* * * * *